(12) United States Patent
Vitale

(10) Patent No.: US 7,892,957 B2
(45) Date of Patent: Feb. 22, 2011

(54) GATE CD TRIMMING BEYOND PHOTOLITHOGRAPHY

(75) Inventor: Steven Arthur Vitale, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/212,784

(22) Filed: Sep. 18, 2008

(65) Prior Publication Data

US 2009/0017607 A1    Jan. 15, 2009

Related U.S. Application Data

(62) Division of application No. 11/359,670, filed on Feb. 22, 2006, now Pat. No. 7,439,106.

(51) Int. Cl.
*H01L 21/3205* (2006.01)
*H01L 21/4763* (2006.01)

(52) U.S. Cl. .............. 438/585; 438/595; 438/596; 257/E21.176; 257/E21.621

(58) Field of Classification Search ........... 438/585, 438/595, 596, E21.176, E21.621
See application file for complete search history.

(56) References Cited

U.S. PATENT DOCUMENTS

| | | | |
|---|---|---|---|
| 6,090,676 A * | 7/2000 | Gardner et al. | 438/303 |
| 6,204,130 B1 * | 3/2001 | Gardner et al. | 438/287 |
| 6,232,189 B1 * | 5/2001 | Yi et al. | 438/301 |
| 6,277,716 B1 | 8/2001 | Chhagan et al. | |
| 6,287,918 B1 | 9/2001 | Xiang et al. | |
| 6,767,835 B1 * | 7/2004 | Nariman et al. | 438/710 |
| 6,811,956 B1 | 11/2004 | Gabriel | |
| 6,852,599 B2 * | 2/2005 | Kim | 438/289 |
| 7,329,913 B2 * | 2/2008 | Brask et al. | 257/287 |
| 2005/0167397 A1 | 8/2005 | Chen et al. | |
| 2005/0287751 A1 | 12/2005 | Mehrad et al. | |
| 2006/0003565 A1 | 1/2006 | Sasaki | |

* cited by examiner

*Primary Examiner*—Phuc T Dang
(74) *Attorney, Agent, or Firm*—Jacqueline J. Garner; Wade J. Brady, III; Frederick J. Telecky, Jr.

(57) ABSTRACT

A semiconductor device is fabricated with a selected critical dimension. A gate dielectric layer is formed over a semiconductor body. A gate layer comprised of a conductive material, such as polysilicon, is formed over the gate dielectric layer. The gate layer is patterned to form a gate electrode having a first horizontal dimension. One or more growth-stripping operations are performed to reduce a critical dimension of the gate electrode to a second horizontal dimension, where the second horizontal dimension is less than the first horizontal dimension.

14 Claims, 5 Drawing Sheets

US 7,892,957 B2

GATE CD TRIMMING BEYOND PHOTOLITHOGRAPHY

CROSS-REFERENCE TO RELATED APPLICATIONS

This application is a DIV of Ser. No. 11/359,670 filed Feb. 22, 2006, U.S. Pat. No. 7,439,106.

FIELD OF INVENTION

The present invention relates generally to semiconductor devices and more particularly to methods for reducing gate critical dimensions beyond conventional lithography limitations.

BACKGROUND OF THE INVENTION

A continuing trend in the field of semiconductor fabrication is to shrink device sizes and dimensions. So doing increases the density of devices on devices and leads to cost savings and performance enhancement. However, conventional fabrication processes can limit or prevent further scaling beyond certain limits.

Feature sizes relate to dimensions of individual components within a semiconductor device. In order to decrease or scale semiconductor devices, the feature sizes of the individual components are also reduced. If one or more of the feature sizes can not be reduced further, the semiconductor devices can be limited for further scaling. Critical dimensions include horizontal and vertical dimensions of features set by doping, layering, photolithography processes, and the like. Conventional fabrication processes result in minimum critical dimensions that can mitigate or prevent further scaling of semiconductor devices.

A significant critical dimension in semiconductor devices is the horizontal dimension of gate layers, post gate etch. This critical dimension can, if reduced, can permit further scaling of transistor semiconductor devices. Photolithography patterning processes employ patterning and resist materials to selectively remove portions of layers, such as gate layers, leaving selected portions as gates. However, conventional photolithography processes are limited to about 40 nanometers. At this dimension and below, photoresist begins to deform and break, also referred to as photoresist shrinkage. As a consequence, further scaling of transistor semiconductor devices including the gates can be limited and/or prevented.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

Aspects of the invention facilitate semiconductor fabrication by facilitating semiconductor devices having critical dimensions below that obtainable with conventional photolithography. A photolithography or other patterning process is employed to form a gate electrode having a first horizontal dimension, which may be a lower limit for photolithography. Subsequently, one or more sequences of a growth operation followed by a stripping operation are performed to further reduce a horizontal or critical dimension of the gate electrode. The growth-stripping operations are performed until a desired or selected horizontal dimension of the gate electrode is obtained.

In accordance with one aspect of the invention, a semiconductor device is fabricated with a selected critical dimension. A gate dielectric layer is formed over a semiconductor body. A gate layer comprised of a conductive material, such as polysilicon, is formed over the gate dielectric layer. The gate layer is patterned to form a gate electrode having a first horizontal dimension. One or more growth-stripping operations are performed to reduce a critical dimension of the gate electrode to a second horizontal dimension, where the second horizontal dimension is less than the first horizontal dimension.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
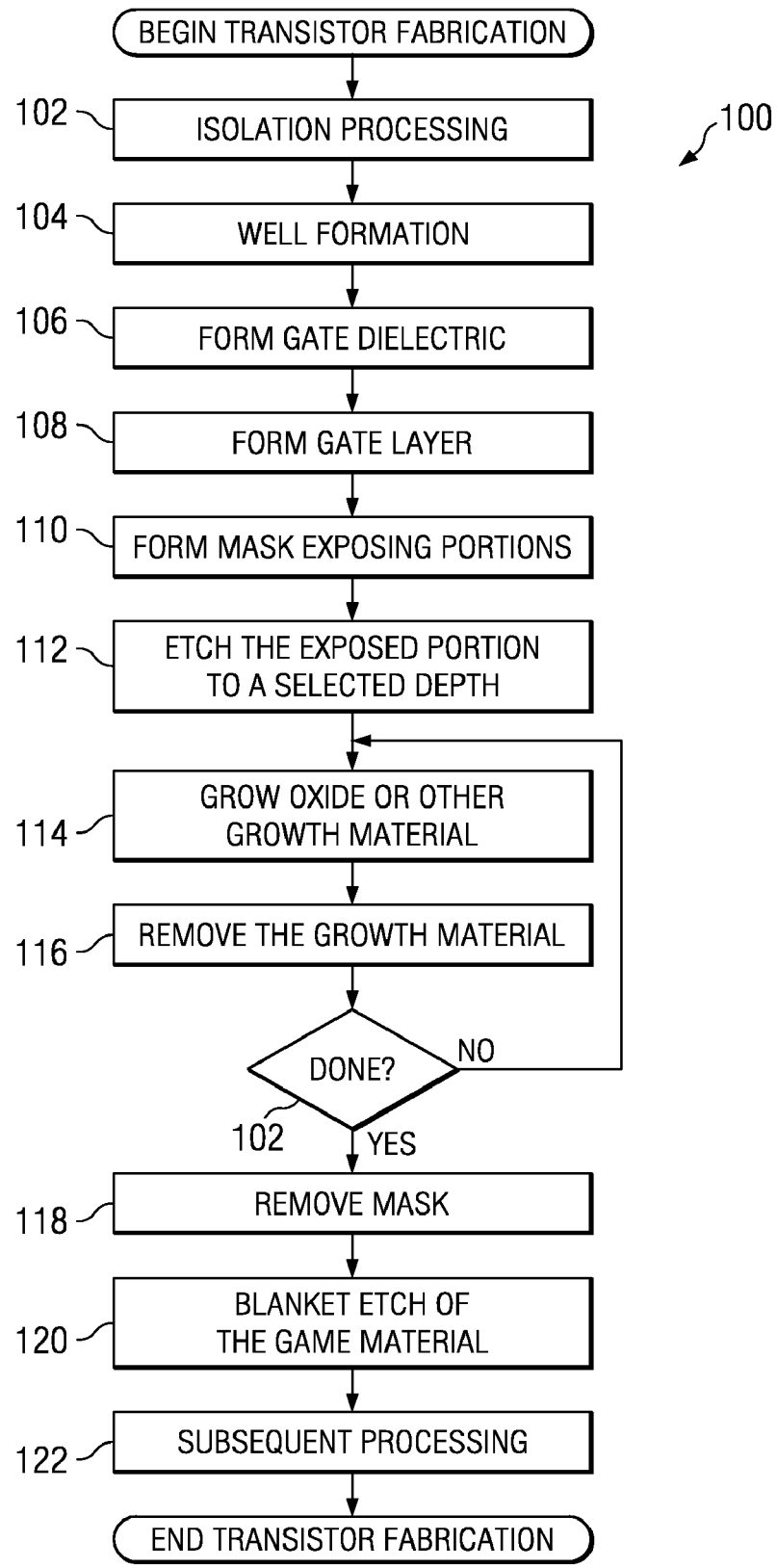
FIG. 1 is a flow diagram illustrating a method of fabricating a semiconductor device in accordance with an aspect of the present invention.

One or more aspects of the present invention are described with reference to the drawings, wherein like reference numerals are generally utilized to refer to like elements throughout, and wherein the various structures are not necessarily drawn to scale. It will be appreciated that where like acts, events, elements, layers, structures, etc. are reproduced, subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

Aspects of the present invention facilitate semiconductor device fabrication and device scaling by reducing gate electrode critical dimensions, post gate etch. Aspects of the present invention include employing a polysilicon oxidation process whereby a partially etched gate is further reduced in critical dimension by oxidizing the gate sidewalls and then stripping the oxide, for example, by a wet chemical bath. The polysilicon oxidation process and oxide strip can be repeated one or more times in order to obtain a desired or selected critical dimension.

Conventional photolithography is limited to forming gates, such as polysilicon gates, to horizontal critical dimensions of greater than 40 nanometers. Below this range, photoresist shrinkage causes photoresist to deform and break and causes sidewalls of gates to become irregular and/or defective.

Aspects of the present invention employ photoresist based patterning and then perform one or more oxidation-stripping cycles until a desired or selected gate critical dimension is obtained.

FIG. 1 is a flow diagram illustrating a method 100 of fabricating a semiconductor device in accordance with an aspect of the present invention. The method 100 fabricates a semiconductor device having a gate with a critical dimension below that obtainable with conventional photolithography.

The method 100 begins at block 102 wherein isolation processing is performed on a semiconductor body. The isolation processing forms isolation structures, such as, shallow trench isolation regions, LOCOS structures, and/or the like. The semiconductor body includes at least a portion of a wafer (e.g., a wafer die) and can include one or more layers of semiconductor materials, epitaxial layers, insulator layers, and the like. For example, the semiconductor body herein can include one or more layers of silicon, one or more layers of germanium, silicon on insulator (SOI) material, germanium on insulator (GOI) material, and the like.

A well region is formed within the semiconductor body at block 104. The well region is formed by implanting a p-type or n-type dopant into the semiconductor body at a selected dose and energy. The well region is formed so as to be p-type for n-type transistor devices and n-type for p-type transistor devices.

A gate dielectric layer is formed over the semiconductor body at block 106. The gate dielectric layer is comprised of a dielectric material, such as oxide. The dielectric material can include low-k and/or high-k dielectric materials. The dielectric layer is formed with a suitable thickness. A gate layer is formed over the gate dielectric layer at block 108. The gate layer is comprised of a conductive material, such as polysilicon and is formed with a suitable thickness.

A mask is formed over the gate layer at block 110 that exposes portions of the gate layer and covers a selected portion of the gate layer. The mask is typically comprised of a photoresist material, however other masking materials can be employed. The selected portion of the gate layer has a first horizontal dimension, which, in one example, is a minimum dimension for the masking material, such as 40 nm for photoresist.

The exposed portions of the gate layer are etched at block 112 to a selected depth to form a gate electrode having the first horizontal dimension. A suitable etch process is employed to etch the exposed portions to the selected depth. In one example, the etch process is performed for at a selected etch rate for a selected duration in order to etch to the selected depth. In another example, interferometry is employed to identify or detect an end point and control the etch process. As films change in thickness, interferometry can be employed to show fringes or changes in reflected light off of the wafer. These fringes can be measured to indicate how much gate material, such as polysilicon, is remaining in order to identify an etch stop or end point signal to the current etch stop. A sufficient thickness of the gate layer should remain for subsequent blocks to consume without damaging the dielectric layer.

One or more oxidation/growth stripping operations are then performed at block 114 and 116 to form the gate electrode with a second horizontal dimension that is less than the first. The oxidation/growth stripping operation includes an oxidation growth at block 114 followed by a stripping operation at block 116. The oxidation growth at block 114 grows material, such as oxide, from the gate material for a selected amount of time or until the oxide growth reaches a desired thickness. A plasma oxidation or other suitable growth process that consumes gate layer material is employed. An example of a suitable plasma oxidation process that can be employed is one performed in an inductively coupled plasma etcher, with a feed gas of 100-300 sccm O2, a pressure of 10-100 mT, and a plasma source power of approximately 1000 W. It is appreciated that other suitable processes can be employed in accordance with the invention.

The stripping operation is then performed at block 116 to remove the growth oxide material. A dry or wet etch selective to the growth material is typically employed for a suitable duration in order to substantially remove the growth material. As a result, the gate electrode has a horizontal dimension less than the first horizontal dimension. An example of a suitable stripping operation is a dry oxide strip process performed in an inductively coupled plasma etcher, with a feed gas mixture of CF4 and CHF3, at a flow rate of 100-200 sccm, a pressure of 4-20 mT, plasma source power of 300-500 W, and 0-200 V bias on the wafer. Another example of a suitable stripping operation is a wet oxide strip process performed by immersion in a solution of HF in H2O, at a ratio of approximately 1:10, at 25° C., for 1 minute. Other suitable stripping operations can be employed in accordance with the invention.

The blocks 114 and 116 can be repeated a number of times in order to obtain the second horizontal dimension for the gate electrode. It is noted that the gate material growth process typically slows in growth rate as the growth material gets thicker. For example, a plasma oxidation process on a gate electrode and layer comprised of polysilicon may take longer to grow the last 2 nm than to grow the first 3 nm of a 5 nm growth. Thus, in some instances, the second horizontal dimension can be obtained by multiple growth-stripping operations in less time than with a single growth-stripping operation.

If the second horizontal dimension has been obtained, then block 118 is performed wherein the mask is removed. A suitable removal process, such as an ashing process, can be employed to remove the mask. A blanket etch of the gate material is then performed at block 120. The blanket etch removes the exposed portion down to about the gate electrode and a portion of the gate electrode layer and is typically selected to the gate material, such as polysilicon.

Subsequently, additional fabrication process can be performed at block 122 to complete fabrication of the device. For example, portions of the dielectric layer not covered by the gate electrode can removed by a suitable etch process. Other processes, such as, spacer formation, source drain formation, silicidation, threshold voltage implants, metallization layer formation, and the like can also be performed.

It is noted that the method 100 can be employed in accordance with the invention to fabricate a plurality of semiconductor devices.

Turning now to FIGS. 2A to 2I, a plurality of fragmentary cross section diagrams are provided illustrating a semiconductor device 200 being formed in accordance with an aspect of the invention. The device 200 is fabricated with a critical dimension below that attainable by conventional photolithography processes. The method 100 of FIG. 1 and/or other methods in accordance with the invention can be employed to fabricate the device 200.

Figure 2A:
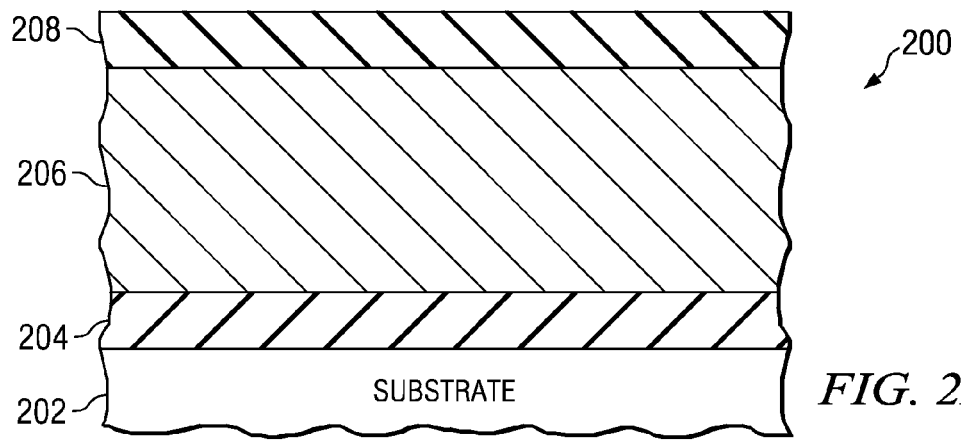
FIGS. 2A to 2I are a plurality of fragmentary cross section diagrams illustrating a semiconductor device formed in accordance with an aspect of the invention.

FIG. 2A is a cross sectional view of the semiconductor device 200 at a stage of fabrication in accordance with an aspect of the present invention. The device 200 includes a semiconductor body 202, which includes at least a portion of a wafer (e.g., a wafer die) and can include one or more layers of semiconductor materials, epitaxial layers, insulator layers, and the like. For example, the semiconductor body 202 herein can include one or more layers of silicon, one or more layers of germanium, silicon on insulator (SOI) material, germanium on insulator (GOI) material, and the like. The semiconductor body 202 typically includes a well region and/or isolation structures, which are not shown for illustrative purposes.

A gate dielectric layer 204 is formed over the semiconductor body 202 and is comprised of a dielectric material, such as oxide. The dielectric material can include low-k and/or high-k dielectric materials. The dielectric layer is formed with a suitable thickness. A gate layer 206 is formed over the gate dielectric layer 204. The gate layer 206 is comprised of a conductive material, such as polysilicon and is formed with a suitable thickness or depth, which includes sacrificial amounts for subsequent removal by stripping and/or etch processes. A mask 208 is formed over the gate layer 206. The mask 208 is comprised of a suitable material, such as photoresist or hard mask material.

Figure 2B:
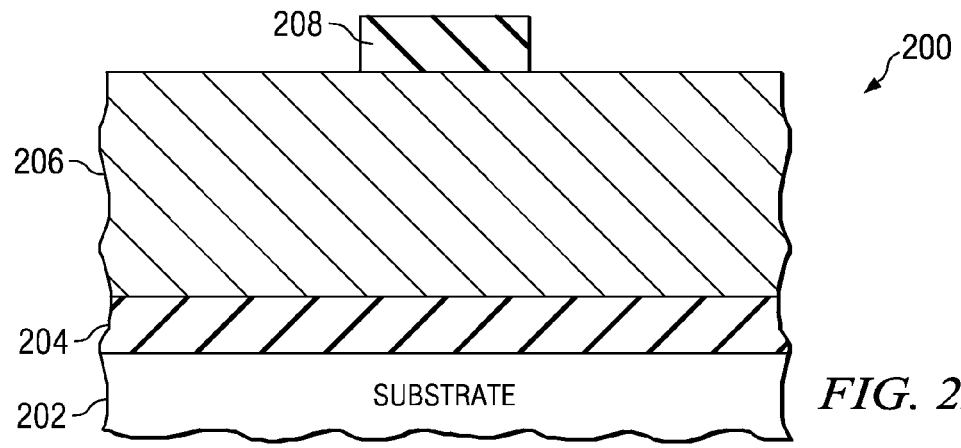

FIG. 2B is a cross sectional view of the semiconductor device 200 at another stage of fabrication in accordance with an aspect of the present invention. A portion of the mask 208 is removed by, for example, a develop/wash process. As a result, the mask 208 remains covering a selected portion of the gate layer 206 and exposes other portions of the gate layer 206. In one example, the selected portion of the gate layer 206 has a horizontal dimension of about 40 nm or more.

Figure 2C:
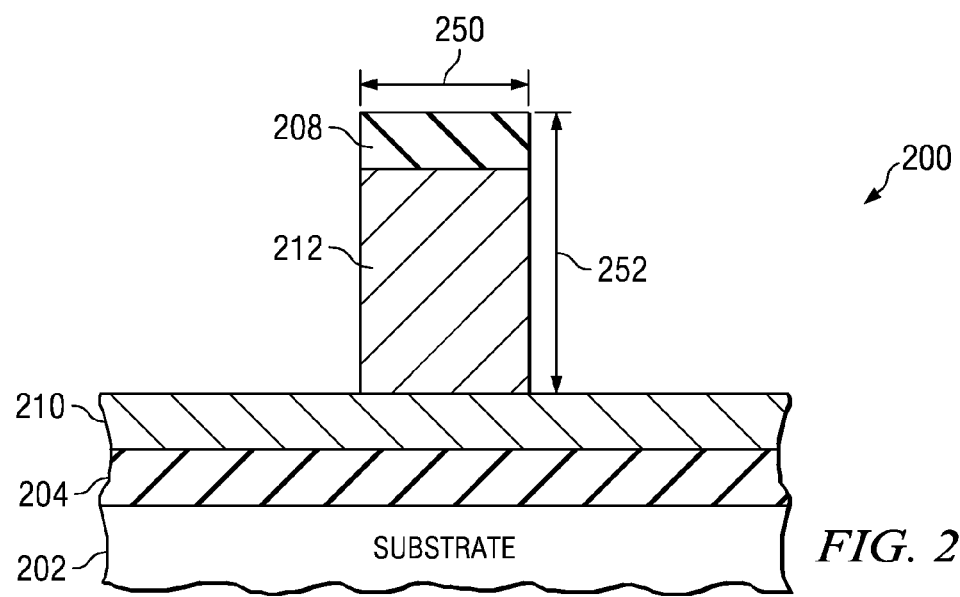

FIG. 2C is a cross sectional view of the semiconductor device 200 at yet another stage of fabrication in accordance with an aspect of the present invention. The selected portion of the gate layer 206, also referred to as a gate electrode 212 remains and has a first horizontal dimension 250. The exposed portions of the gate layer 206 have been etched to a selected depth 252. The selected depth 252 typically leaves sufficient gate material within the exposed portions to mitigate damage to the underlying dielectric layer 204. The etch of the exposed portions, for example, can employ timing or other mechanisms for end point detection, such as interferometry, in order to control the etch to the selected depth 252.

Figure 2D:
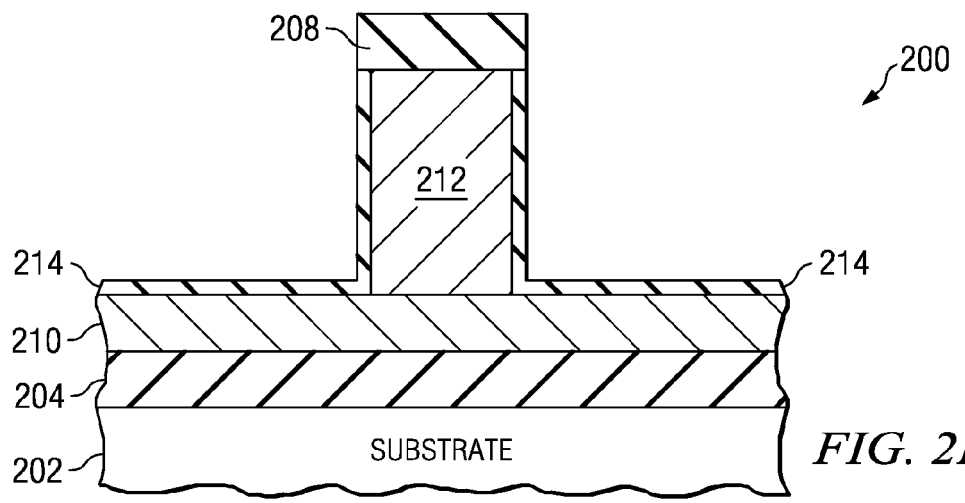

FIG. 2D is a cross sectional view of the semiconductor device 200 at another stage of fabrication in accordance with an aspect of the present invention. A growth process, such as a plasma oxidation process, is employed to grow material 214, such as oxide, to a desired thickness. The growth process typically lasts an amount of time selected according to the particular growth process and the desired thickness. The desired thickness of the growth material 214 can vary, however some examples include 1 to 5 nanometers. It can be seen that the growth material 214 occurs at sidewalls of the gate electrode 212 and along exposed upper surfaces of the gate layer 206 and that the growth material 214 consumes gate material.

Figure 2E:
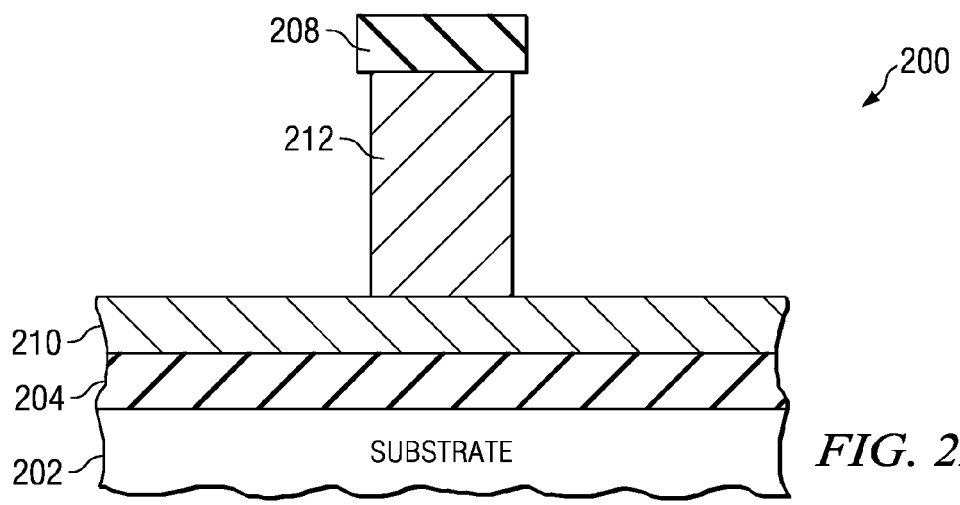

FIG. 2E is a cross sectional view of the semiconductor device 200 at yet another stage of fabrication in accordance with an aspect of the present invention. The growth material 214 has been removed and it can be seen that the gate electrode 212 has a critical dimension narrower than the first horizontal dimension 250. A suitable stripping operation or etch can be employed to remove the growth material 214. For example, a dry or wet etch selective to the growth material can be employed for a suitable duration in order to substantially remove the growth material 214.

Figure 2F:
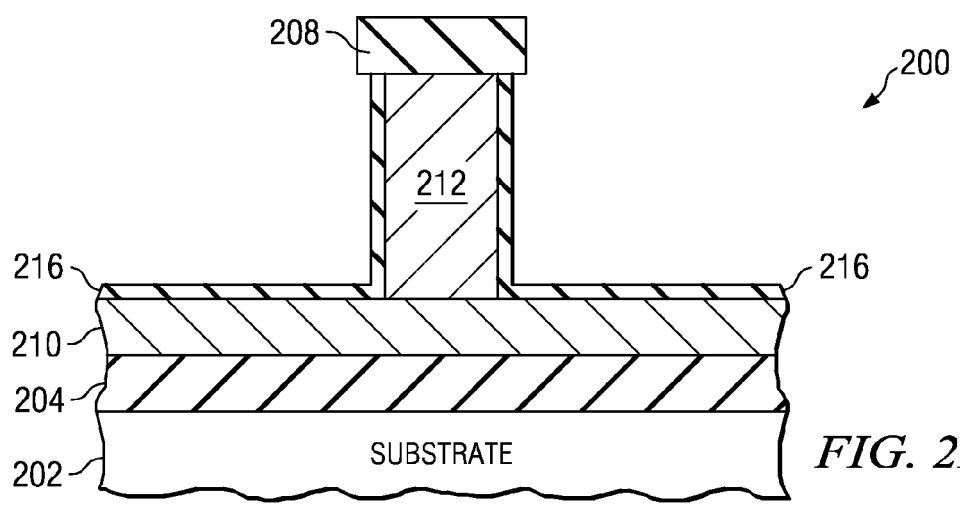

FIG. 2F is a cross sectional view of the semiconductor device 200 at another stage of fabrication in accordance with an aspect of the present invention. A second growth process is employed to grow second material 216, such as oxide, to a second desired/selected thickness. The growth process typically lasts a second amount of time selected according to the particular growth process and the second selected thickness. The second selected thickness of the growth material 216 can vary or be substantially similar or substantially varied from the first desired thickness. Once again, it can be seen that the second growth material 216 occurs at sidewalls of the gate electrode 212 and along exposed upper surfaces of the gate layer 206 and that the growth material 216 consumes gate material.

Figure 2G:
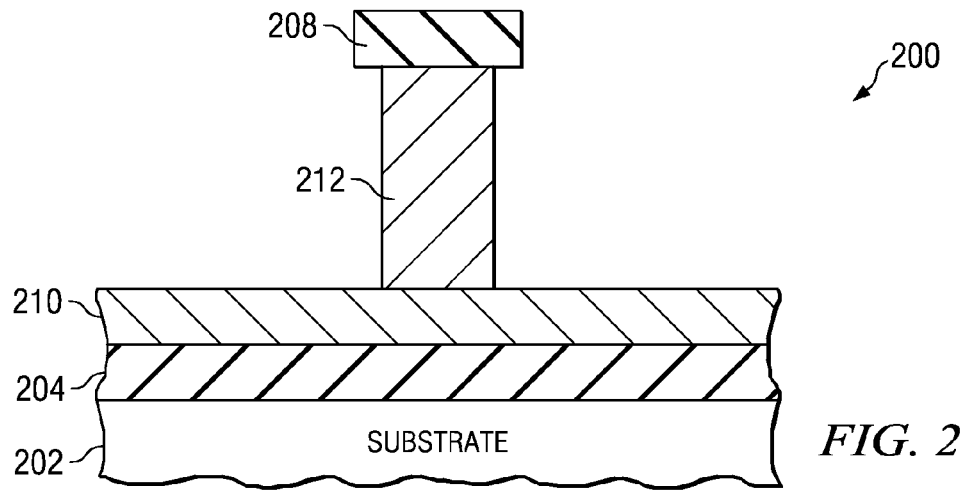

FIG. 2G is a cross sectional view of the semiconductor device 200 at yet another stage of fabrication in accordance with an aspect of the present invention. The growth material 216 has been removed and it can be seen that the gate electrode 212 has a critical dimension narrower than shown in FIG. 2E. A suitable stripping operation or etch can be employed to remove the growth material 216. In this example, the critical dimension is about equal to a second horizontal dimension 254, which is the target horizontal dimension for the gate electrode 212. Otherwise, additional growth-strip operations could be performed to further reduce the critical dimension of the gate electrode 212.

Figure 2H:
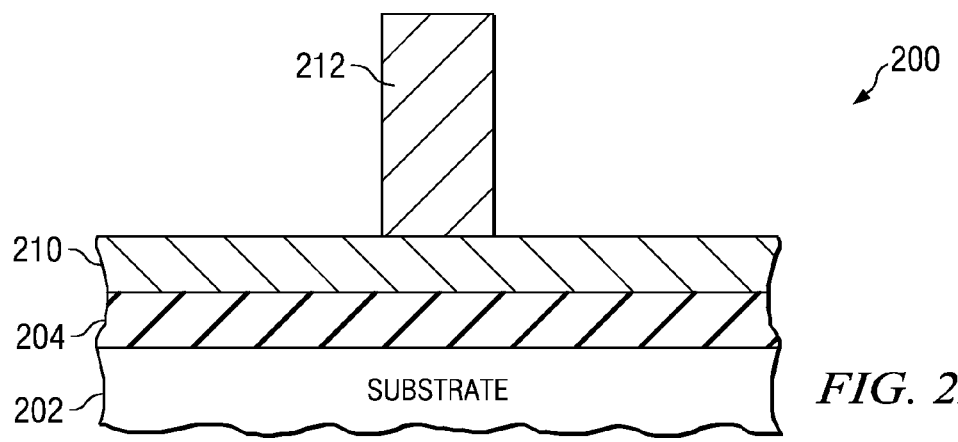
Figure 2I:
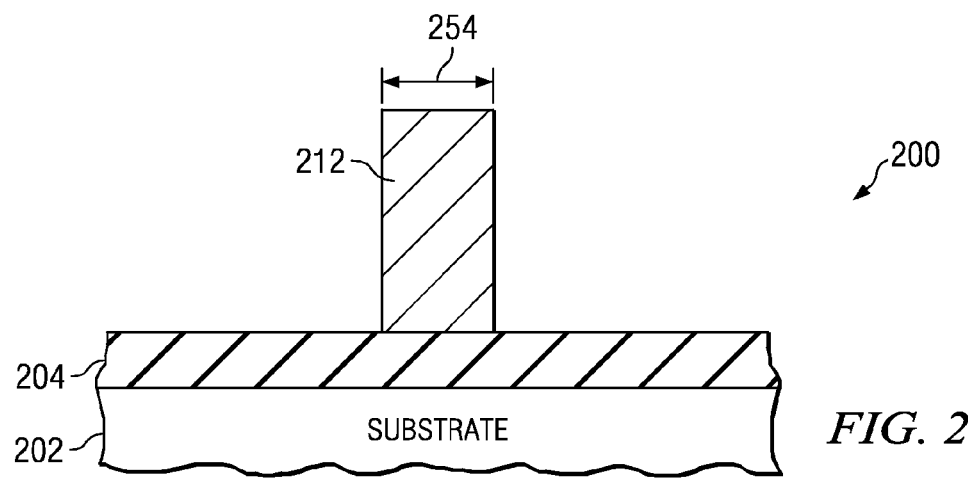

FIG. 2H is a cross sectional view of the semiconductor device 200 at another stage of fabrication in accordance with an aspect of the present invention. The mask 208 has been removed thereby exposing the gate electrode 212. Then, an anisotropic blanket etch is performed selective to gate material is performed that removes a portion of the gate electrode 212 and exposed portions of the gate layer 206. FIG. 2I is a cross sectional view of the semiconductor device 200 at yet another stage of fabrication in accordance with an aspect of the present invention. The exposed portion of the gate layer 206 is shown as removed and the gate electrode 212 is shorter. The second horizontal dimension 254 of the gate electrode 212 is shown.

Other fabrication process, such as, dielectric layer etch, spacer formation, source drain formation, silicidation, threshold voltage implants, metallization layer formation, and the like can also be performed.

Figure 3:
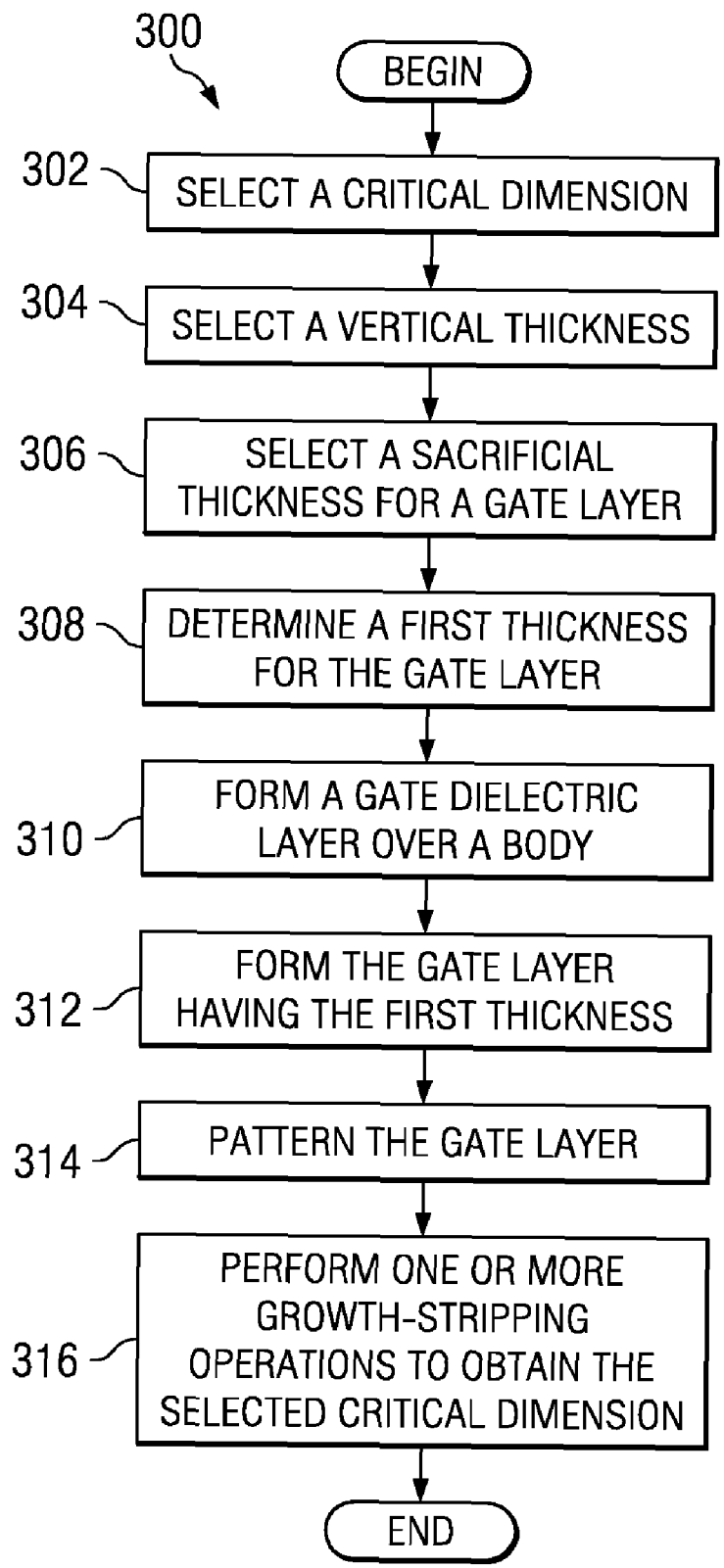
FIG. 3 is a flow diagram illustrating a method of fabricating a semiconductor device in accordance with an aspect of the present invention.

FIG. 3 is a flow diagram illustrating a method 300 of fabricating a semiconductor device in accordance with an aspect of the present invention. The method 300 fabricates a device having a selected critical dimension by employing a growth-stripping process to obtain critical dimensions not possible with conventional photolithography.

The method 300 begins at block 302, wherein a critical dimension for a gate electrode is selected. The critical dimension is a horizontal dimension for the gate electrode. Typically, but not necessarily, the critical dimension is less than values obtainable via conventional photolithography processes. In one example, the critical dimension is selected as being less than 30 nanometers where the minimum obtainable via conventional photolithography is 40 nanometers. Other parameters for the gate electrode, such as material composition, and the like can also be selected. A vertical thickness for the gate layer is selected at block 304.

A sacrificial thickness for a gate layer is selected at block 306. The sacrificial thickness is at least a minimum thickness value and provides sufficient thickness to mitigate damage to an underlying gate dielectric layer. The minimum thickness is determined as a function of the selected critical dimension and photolithography dimension, which is a horizontal dimension for the gate electrode obtainable through photolithography.

Then, a first thickness for the gate layer is determined at block 308 according to the selected critical dimension, the selected vertical thickness of the gate, the photolithography dimension, and the sacrificial thickness. In one example, the first thickness is equal to a sum of the selected vertical thickness, the selected critical dimension, and the sacrificial thickness subtracted by the photolithography dimension.

A gate dielectric layer is formed over a semiconductor body at block 310. The gate dielectric layer is comprised of a dielectric material, including high-k and/or low-k dielectric materials. A gate layer is formed over the gate dielectric layer at block 312 having the first thickness. The gate layer is comprised of a conductive material, such as polysilicon. The gate layer is patterned according the photolithography dimension at block 314. The exposed, patterned portions of the gate layer are etched to a second thickness, which is a sum of the sacrificial thickness and half the difference of the photolithography dimension and the selected critical dimension. Typically, a resist mask is employed to expose portions of the gate layer.

One or more growth-stripping operations are then performed on the gate layer to form a gate electrode having the selected critical dimension at block 316. The growth-stripping operations comprise a growth process that consumes gate material followed by a stripping process that removes the growth material, thereby reducing a horizontal dimension of the gate electrode. Each growth-stripping operation is controlled to consume and reduce the gate's horizontal dimension by a specified amount, which can vary or not for subsequent growth-stripping operations. The growth-stripping operations are repeated until the selected critical dimension is obtained.

The growth-stripping operations can, in some instances, provide enough horizontal dimension reduction of the gate electrode in a single operation. However, the growth process can be non-linear and require increased amounts of time for larger growths. As such, the method 300 can determine to perform multiple growth-stripping operations instead of a single growth-stripping operation. As one example, a 5 nanometer growth process may take 10 times as long as a 2 nanometer growth process. In this example, performing two or three sequential growth-stripping operations can be faster than a single growth-stripping process.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. The term "exemplary" as used herein is intended to imply an example and not a best solution or implementation. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of fabricating a semiconductor device comprising:
    selecting a critical dimension for a gate electrode;
    selecting a vertical thickness for the gate electrode;
    selecting a sacrificial thickness for a gate layer;
    determining a first thickness for the gate layer according to the selected critical dimension, the selected vertical thickness, and the selected sacrificial thickness;
    forming a gate dielectric layer over a semiconductor body;
    forming the gate layer having the first thickness over the gate dielectric layer;
    patterning the gate layer to form the gate electrode; and
    performing a plurality of growth-stripping operations on the gate layer to obtain the selected critical dimension for the gate electrode.

2. The method of claim 1, wherein the critical dimension is less than a photolithography obtainable limit.

3. A method of fabricating a semiconductor device comprising:
    selecting a critical dimension for a gate electrode;
    selecting a vertical thickness for the gate electrode;
    selecting a sacrificial thickness for a gate layer, wherein the sacrificial thickness is selected to mitigate damage to the gate dielectric layer;
    determining a first thickness for the gate layer according to the selected critical dimension, the selected vertical thickness, and the selected sacrificial thickness;
    forming a gate dielectric layer over a semiconductor body;
    forming the gate layer having the first thickness over the gate dielectric layer;
    patterning the gate layer to form the gate electrode; and
    performing one or more growth-stripping operations on the gate layer to obtain the selected critical dimension for the gate electrode.

4. The method of claim 1, wherein determining the first thickness further comprises identifying a minimum photolithography dimension.

5. The method of claim 4, further comprising determining a number of the plurality of growth-stripping operations to perform.

6. A method of fabricating a semiconductor device comprising:
    selecting a critical dimension for a gate electrode;
    selecting a vertical thickness for the gate electrode;
    selecting a sacrificial thickness for a gate layer;
    determining a first thickness for the gate layer according to the selected critical dimension, the selected vertical thickness, and the selected sacrificial thickness;
    forming a gate dielectric layer over a semiconductor body;
    forming the gate layer having the first thickness over the gate dielectric layer;
    forming a mask layer over the gate layer;
    etching the gate layer using the mask layer to form the gate electrode, wherein said step of etching the gate layer etches the gate layer to a first depth less than the first thickness to leave a remaining portion of the gate layer adjacent to the gate electrode and wherein said one or more growth-stripping operations is also performed on said remaining portion of the gate layer; and
    after etching the gate layer, performing one or more growth-stripping operations on the gate layer to obtain the selected critical dimension for the gate electrode.

7. The method of claim 6, wherein the critical dimension is less than a photolithography obtainable limit.

8. The method of claim 6, wherein determining the first thickness further comprises identifying a minimum photolithography dimension.

9. The method of claim 6, further comprising determining a number of the one or more growth-stripping operations to perform.

10. The method of claim 6, wherein the one or more growth stripping operations comprise the steps of:
    performing a polysilicon oxidation process to form an oxide growth material, and
    stripping the oxide growth material.

11. The method of claim 6, wherein the mask layer comprises a photoresist material.

12. The method of claim 1, wherein the plurality of growth stripping operations comprise the steps of:
    performing a polysilicon oxidation process to form an oxide growth material, and
    stripping the oxide growth material.

13. The method of claim 1, wherein the step of patterning the gate layer comprises photolithographically patterning the gate layer.

14. A method of fabricating a semiconductor device comprising:
    selecting a critical dimension for a gate electrode;
    selecting a vertical thickness for the gate electrode;
    selecting a sacrificial thickness for a gate layer;
    determining a first thickness for the gate layer according to the selected critical dimension, the selected vertical thickness, and the selected sacrificial thickness;
    forming a gate dielectric layer over a semiconductor body;
    forming the gate layer having the first thickness over the gate dielectric layer;
    forming a mask layer over the gate layer;
    etching the gate layer using the mask layer to form the gate electrode;
    after etching the gate layer, performing one or more growth-stripping operations on the gate layer to obtain the selected critical dimension for the gate electrode; and
    removing the mask layer after performing the one or more growth-stripping operations.

* * * * *